United States Patent
Lee et al.

(10) Patent No.: US 8,468,410 B2
(45) Date of Patent: *Jun. 18, 2013

(54) ADDRESS GENERATION APPARATUS AND METHOD FOR QUADRATIC PERMUTATION POLYNOMIAL INTERLEAVER

(75) Inventors: Shuenn-Gi Lee, Hsinchu (TW); Chung Hsuan Wang, Hsinchu (TW); Wern-Ho Sheen, Chiayi (TW)

(73) Assignees: Industrial Technology Research Institute, Hsinchu (TW); National Chiao Tung University, Hsinchu (TW)

( * ) Notice: Subject to any disclaimer, the term of this patent is extended or adjusted under 35 U.S.C. 154(b) by 359 days.

This patent is subject to a terminal disclaimer.

(21) Appl. No.: 12/892,199

(22) Filed: Sep. 28, 2010

(65) Prior Publication Data

US 2012/0047414 A1 Feb. 23, 2012

(30) Foreign Application Priority Data

Aug. 19, 2010 (TW) ............................... 99127734 A

(51) Int. Cl.
*G06F 11/00* (2006.01)

(52) U.S. Cl.
USPC ............ 714/743; 714/702; 711/127; 711/157

(58) Field of Classification Search
USPC ........................ 714/743, 702; 711/127, 157
See application file for complete search history.

(56) References Cited

U.S. PATENT DOCUMENTS

| | | | |
|---|---|---|---|
| 2002/0159423 A1 | 10/2002 | Yao et al. | |
| 2008/0115034 A1* | 5/2008 | Cheng | 714/755 |
| 2008/0172590 A1 | 7/2008 | Shen et al. | |
| 2008/0172591 A1 | 7/2008 | Shen et al. | |
| 2009/0249024 A1* | 10/2009 | Jones et al. | 711/219 |
| 2010/0005221 A1* | 1/2010 | Nieminen | 711/5 |
| 2010/0070737 A1* | 3/2010 | Stirling et al. | 711/217 |

FOREIGN PATENT DOCUMENTS

CN 101777923 A 7/2010

OTHER PUBLICATIONS

J. Sun and O. Y. Takeshita, "Interleavers for turbo codes using permutation polynomials over integer rings," IEEE Trans. on Inform. Theory, vol. 51, No. 1, pp. 101-119, Jan. 2005.

R. Dobkin, M. Peleg, and R. Ginosar, "Parallel interleaver design and VLSI architecture for low-latency MAP turbo decoders," IEEE Trans. on VLSI Systems, vol. 13, No. 4, pp. 427-438, Apr. 2005.

Maurizio Martina, Mario Nicola, and Guido Masera, "A Flexible UMTS-WiMax Turbo Decoder Architecture", IEEE Transactions on Circuits and Systems-II: Express Briefs, vol. 55, No. 4, Apr. 2008.

Oscar Y. Takeshita et al., "New Deterministic Interleaver Designs for Turbo Codes", IEEE Tran. on Information Theory, Sep. 6, 2000, p. 1988-p. 2006.

(Continued)

*Primary Examiner* — M. Mujtaba K Chaudry

(74) *Attorney, Agent, or Firm* — Rabin & Berdo, P.C.

(57) ABSTRACT

An address generation apparatus for quadratic permutation polynomial (QPP) interleaver receives several configurable parameters and uses a plurality of QPP units to compute and outputs a plurality of interleaving addresses according to a QPP function $\Pi(i)=(f_1 i+f_2 i^2) \bmod k$, where $f_1$ and $f_2$ are QPP coefficients, k is information block length of an input sequence, $0 \leq i \leq k-1$, and mod is a modulus operation. Each of the plurality of QPP units is a parallel computation unit, and outputs in parallel a corresponding group of interleaver addresses, where $\Pi(i)$ is also a $i^{th}$ interleaving address generated by the apparatus.

16 Claims, 16 Drawing Sheets

OTHER PUBLICATIONS

A. Nimbalker, Y. Blankenship, B. Classon, T. Keith Blankenship, "ARP and QPP interleavers forLTE Turbo coding", IEEE WCNC, Mar. 31, 2008, p. 1032-p. 1037.

A. Nimbalker, Daniel J. Costello, "Contention-Free Interleavers for High-Throughput Turbo decoding", IEEE Trans. on Communications, Aug. 8, 2008, p. 1258-p. 1267.

L. Zhang, Y. Xu, X. Ma, H. Luo, and X. Gan, "Study on Interleaver Design for Turbo codes using Permutation Polynomials over integer rings", IEEE VTC, Sep. 25, 2006, p. 1-p. 5.

U.S. Appl. No. 12/647,394, filed Dec. 25, 2009.

* cited by examiner

| Data Index | Interleaver Address | MAP Processor | Binary | LSB 3 Bits (Memory Address) | MSB 3 Bits | Memory |
|---|---|---|---|---|---|---|
| 0 | Π(0)=0 | 1 | 000000 | 000 | 000 | 0 |
| 8 | Π(0+8)=24 | 2 | 011000 | 000 | 011 | 3 |
| 16 | Π(0+16)=8 | 3 | 001000 | 000 | 001 | 1 |
| 24 | Π(0+24)=32 | 4 | 100000 | 000 | 100 | 4 |
| 32 | Π(0+32)=16 | 5 | 010000 | 000 | 010 | 2 |
| 1 | Π(1)=3 | 1 | 001101 | 101 | 001 | 1 |
| 9 | Π(9)=37 | 2 | 100101 | 101 | 100 | 4 |
| 17 | Π(17)=21 | 3 | 010101 | 101 | 010 | 2 |
| 25 | Π(25)=5 | 4 | 000101 | 101 | 000 | 0 |
| 33 | Π(33)=29 | 5 | 011101 | 101 | 011 | 3 |
| ... | ... | ... | ... | ... | ... | ... |

FIG. 12

ADDRESS GENERATION APPARATUS AND METHOD FOR QUADRATIC PERMUTATION POLYNOMIAL INTERLEAVER

TECHNICAL FIELD

The disclosure generally relates to an address generation apparatus and method for quadrate permutation polynomial (QPP) interleaver, capable for generating increasing or decreasing interleaver addresses.

BACKGROUND

The design of the popular turbo code interleaver is usually achieved by storing a pre-calculated interleaver addresses in a memory or an address look-up table. When an interleaver address is needed, the address may be read from the memory or the address look-up table. This approach consumes both a large circuitry area and much power. Take LTE turbo code as example. The decoding length may range from 40 to 6144 bits. For the 188 types of decoding length, the memory is required to store 188 sets of interleaver addresses of length between 40 and 6144 bits. The maximum of the storage required for 6144-bit interleaver is up to 6144×13=79872 bits.

U.S. Publication No. US2008/0115034 disclosed a QPP interleaver, applicable to a coder/decoder for turbo code. The prior art describes the algorithm for serially generating interleaver addresses. The n-th value, $\Pi(n)$, of the sequence outputted by the address generator may be expressed as:

$$\Pi(n)=(f_1 n+f_2 n^2) \bmod k,\ n=0, 1, \ldots, k-1,$$

where $\Pi(n)$ is the n-th interleaved output position, $f_1$ and $f_2$ are QPP coefficients, k is the information block length of the input sequence and mod is the modulus operation.

As shown in FIG. 1, control unit 106 uses a modulo-counter 108 to provide an input index n to an address generator 104 and generates a control signal 108a for inputting to address generator 104 and an interleaver memory 102 respectively to indicate whether the operation is a read operation or a write operation. The values of $\Pi(n)$ calculated by address generator 104 are stored in interleaver memory 102. When interleaver address $\Pi(n)$ is needed, the address is read from interleaver memory 102 serially. The calculated interleaver addresses are contention-free.

U.S. Publication No. US2002/0159423 disclosed a technique to efficiently generate memory addresses for a turbo code interleaver using a number of look-up tables. U.S. Pat. No. 6,845,482 disclosed a technique to automatically generate interleaver addresses. The turbo code interleaver uses an element for generating prime-number index information and five look-up tables to generate memory addresses of the turbo code interleaver.

The above techniques describe the theory of the algorithm, architecture and process for serially generating interleaver addresses. Most of the parallel operation techniques emphasize more on improving the performance of the parallel processing of log-Maximum a Posteriori (MAP) processor, and less on the efficient design for executing the parallel interleaving of the output from the parallel computing and storing to a memory. However, in actual hardware or circuit design, if an architecture based on parallel address generator used for decoder architecture, such as, parallel turbo decoder using a plurality of log-MAP for parallel operation, the parallel address generator may improve the output rate of the decoder.

U.S. patent application Ser. No. 12/647,394 (filed by the applicant on Dec. 25, 2009) disclosed an address generating apparatus for QPP interleaver. The apparatus is based on a QPP function $\Pi(i)=(f_1 i+f_2 i^2) \bmod k$, inputs several configurable parameters generates a plurality of interleaver addresses sequentially via a basic recursive unit, and generates a plurality of corresponding groups of interleaver addresses in parallel via a plurality of recursive units. Based on the computation result of the interleaver address, each sequentially inputted data may be written to a corresponding memory address via a data multiplexer.

SUMMARY

The exemplary embodiments may provide an address generation apparatus and method for QPP interleaver.

In an exemplary embodiment, the disclosed relates to an address generation apparatus for QPP interleaver addresses. The apparatus comprises L QPP units, represented as QPP unit 1 to QPP unit L, $L \geq 2$. The apparatus is according to a QPP function $\Pi(i)=(f_1 i+f_2 i^2) \bmod k$, where $f_1$ and $f_2$ are QPP coefficients, k is information block length of an input sequence, $0 \leq i \leq k-1$. The apparatus uses the L QPP units to compute and output a plurality of interleaver addresses, where $\Pi(i)$ is an $i^{th}$ interleaving address generated by the apparatus and each QPP unit j, $1 \leq j \leq L$, is a parallel computation unit and outputs in parallel a corresponding group of interleaver addresses.

In another exemplary embodiment, the disclosed relates to an address generation method for QPP interleaver addresses, applicable to a coder/decoder of a communication system. The method comprises: inputting several configurable parameters according to a QPP function $\Pi(i)=(f_1 i+f_2 i^2) \bmod k$; and computing and outputting a plurality of interleaver addresses by using L QPP units, where $L \geq 2$, each QPP unit j, $1 \leq j \leq L$, being a parallel computation unit and outputting in parallel a corresponding group of interleaver addresses, where $\Pi(i)$ being an $i^{th}$ interleaving address generated by the method, $f_1$ and $f_2$ are QPP coefficients, k is information block length of an input sequence. In this manner, the input sequence of information is stored into a plurality of corresponding memory addresses.

The foregoing and other features, aspects and advantages of the present disclosure will become better understood from a careful reading of a detailed description provided herein below with appropriate reference to the accompanying drawings.

BRIEF DESCRIPTION OF THE DRAWINGS

FIG. 12 shows an exemplary table, with k=40, M=$2^3$, $f_1$=3, $f_2$=10, of how QPP interleaver address generation apparatus computes interleaver addresses and determines memory addresses, consistent with certain disclosed embodiments.

DETAILED DESCRIPTION OF THE EXEMPLARY EMBODIMENTS

The exemplary embodiments of the present disclosure provide an address generation apparatus and method for QPP interleaver. The QPP address generation technology uses the design of a plurality of parallel computation circuits to compute the increasing or decreasing interleaver addresses, and is able to output the computation results in parallel. The QPP interleaver address generation apparatus may also be used as interleaver or de-interleaver address generator. When used as de-interleaver address generator, the output interleaver address is treated as reading a memory address.

Figure 1:
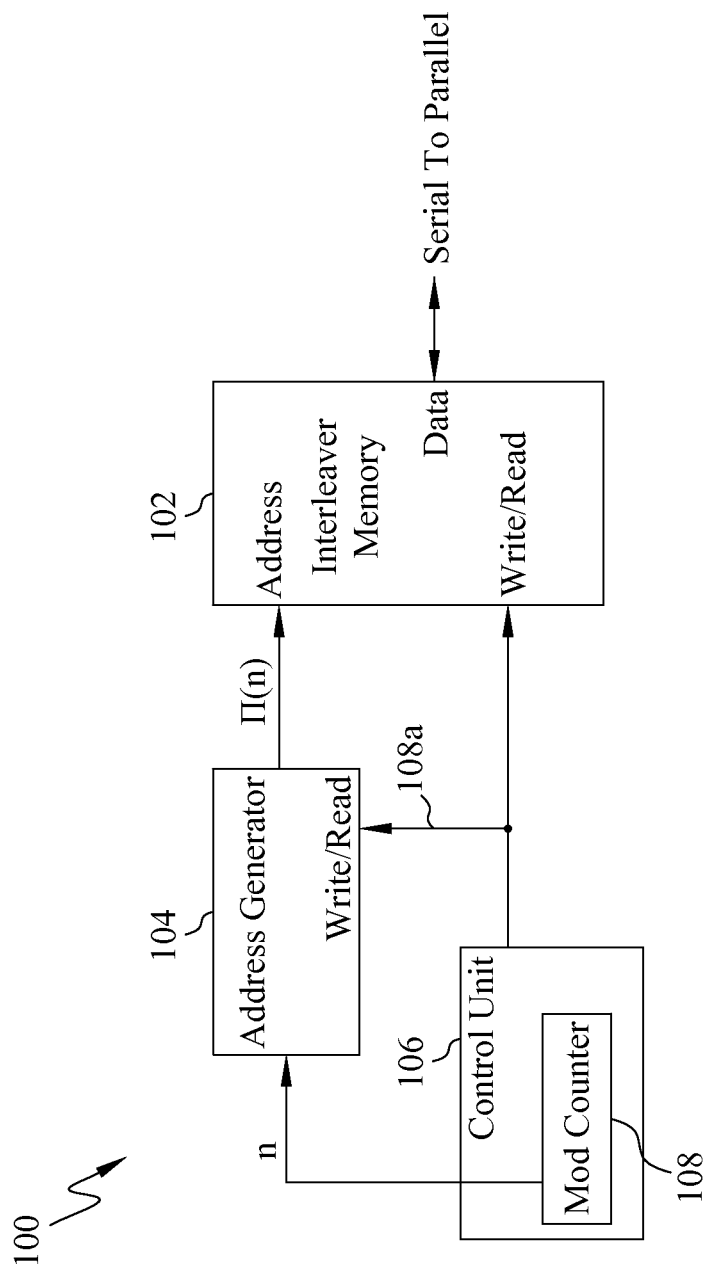
FIG. 1 shows an exemplary schematic view of a prior-art QPP interleaver.
Figure 2:
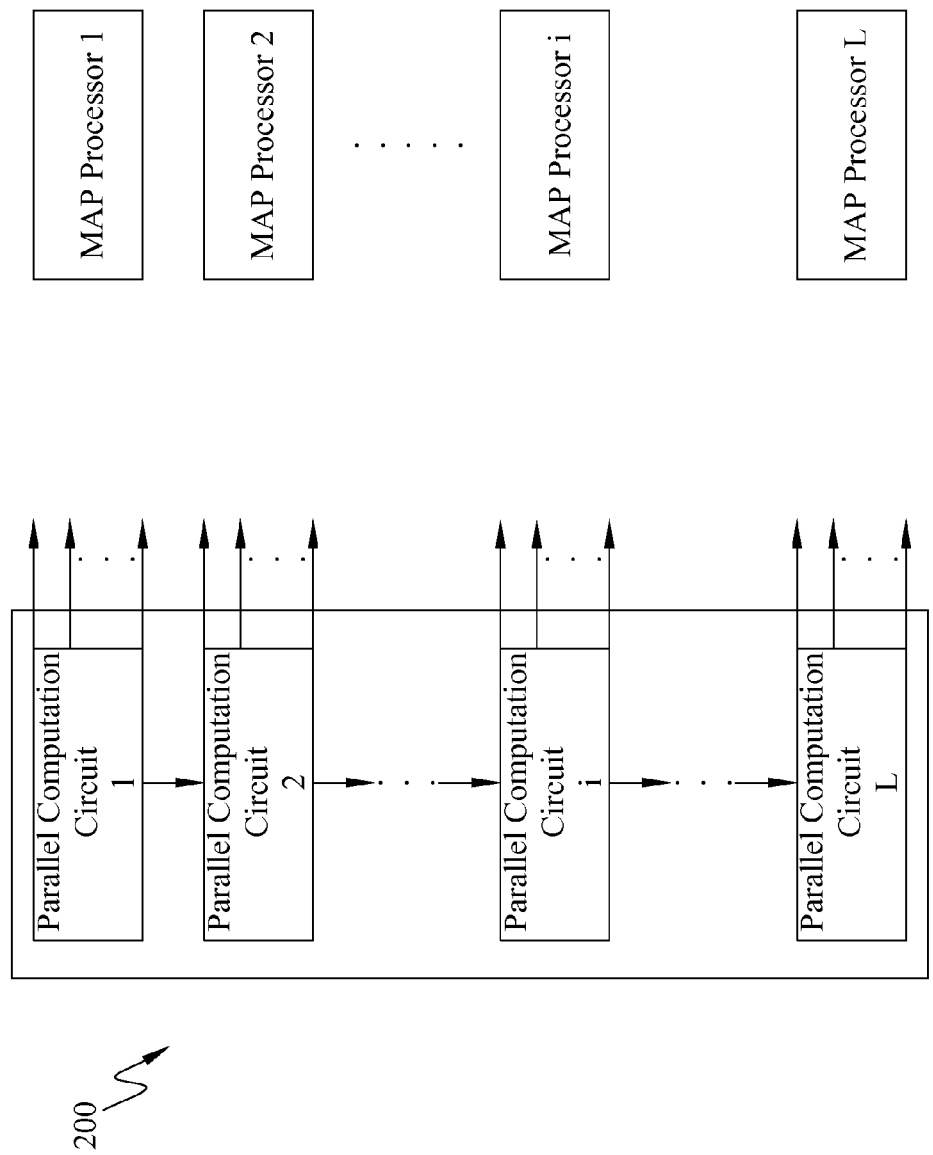
FIG. 2 shows an exemplary schematic view of a QPP interleaver, consistent with certain disclosed embodiments.

As shown in the example in FIG. 2, a QPP interleaver 200 utilizes a plurality of parallel computation circuits, such as, parallel computation circuits 1 to parallel computation circuit L, to output the address computation results in parallel, consistent with certain disclosed embodiments. When applied in the MAP processor parallel decoder architecture of different radix-R architecture, the outputted address computation results from parallel computation circuits 1 to parallel computation circuit L may be mapped to the radix-R (=$2^r$) architecture used by each of L MAP processors, such as, MAP processor 1 to MAP processor L. For the turbo code designer, the above design is attractive because targeting at different radix of MAP processor, the corresponding QPP interleaver addresses that QPP interleaver 200 directly computes in parallel and generates, may include increasing interleaver address or decreasing interleaver address to correspond to the increasing or decreasing metrics computation of the MAP processor.

Figure 3:
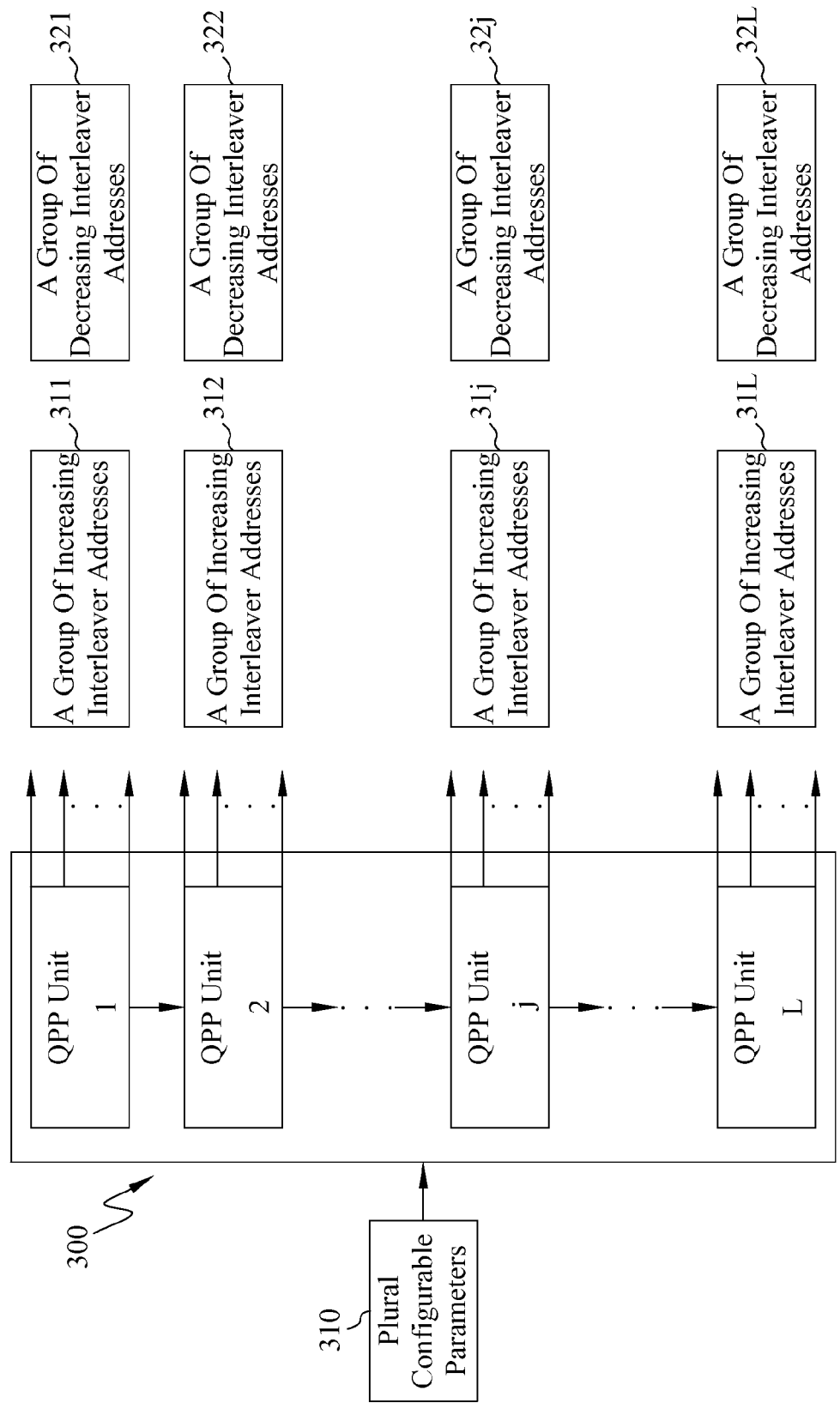
FIG. 3 shows an exemplary address generation apparatus for QPP interleaver, consistent with certain disclosed embodiments.

FIG. 3 shows an exemplary address generation apparatus for QPP interleaver, consistent with certain disclosed embodiments. In FIG. 3, QPP interleaver address generation apparatus 300 comprises L QPP units, represented as QPP unit 1 to QPP unit L, L≧2. QPP interleaver address generation apparatus 300 receives several configurable parameters 310 according to a QPP function $\Pi(i)=(f_1 i+f_2 i^2)$ mod k, where $f_1$ and $f_2$ are QPP coefficients, k is information block length of an input sequence, 0≦i≦k−1, and compute and output a plurality of interleaver addresses by using the L QPP units, where $\Pi(i)$ is an $i^{th}$ interleaving address generated by QPP interleaver address generation apparatus 300 and each QPP unit j, 1≦j≦L, is a parallel computation unit and outputs in parallel a corresponding group of interleaver addresses.

A group of interleaver addresses outputted in parallel by each QPP unit j may be a group of increasing interleaver addresses 31j or a group of decreasing interleaver addresses 32j. The group of increasing interleaver addresses 31j or decreasing interleaver addresses 32j may be applied to a parallel decoder architecture of MAP processor of different radix architecture to correspond to the increasing or decreasing metrics computation of MAP processor.

For 2≦j≦L, QPP unit j receives the computation result from the previous QPP unit j−1 respectively, and simultaneously computes in parallel a corresponding group of increasing interleaver addresses 31j or decreasing interleaver addresses 32j. The group of increasing interleaver addresses 31j and the group of decreasing interleaver addresses 32j may be expressed as following, respectively:

$$\Pi(i+(j-1)M), \Pi(i+(j-1)M+1), \ldots, \Pi(i+(j-1)M+(r-1)), \text{ and}$$

$$\Pi(jM-i-1), \Pi(jM-i-2), \ldots; \Pi(jM-i-r),$$

where M is the width of the sliding window of the outputted information of the inputted sequence.

For a MAP processor j with radix-$2^r$, 1≦j≦L, the corresponding QPP interleaver addresses generated by QPP unit j are described as follows. Because QPP function $\Pi(i)=(f_1 i+f_2 i^2)$ mod k, i=0, 1, ..., k−1; therefore, for j=1, a group of increasing interleaver addresses 311 corresponding to QPP unit 1 is arranged as:

$$\Pi(i+1)=(f_1(i+1)+f_2(i+1)^2)\bmod k=(\Pi(i)+f_2+f_1+2f_2 i) \bmod k, i=0, 1, \ldots, k-1 \quad (1),$$

and a group of decreasing interleaver addresses 321 corresponding to QPP unit 1 is arranged as:

$$\Pi(i-1)=(f_1(i-1)+f_2(i-1)^2)\bmod k=(\Pi(i)+f_2-f_1-2f_2 i) \bmod k, i=0, 1, \ldots, k-1 \quad (2)$$

In this manner, QPP unit 1 may compute in parallel the increasing interleaver addresses $\Pi(i), \Pi(i+1), \ldots, \Pi(i+(r-1))$ according to equation (1), and compute in parallel the decreasing interleaver addresses $\Pi(M-i-1), \Pi(M-i-2), \ldots, \Pi(M-r-1)$ according to equation (2).

Because $\Pi(i+M)=(\Pi(i)+f_1 M+f_2 M^2+2f_2 Mi)$ mod k, i=0, 1, ..., k−1, thus, for 2≦j≦L, the first group of addresses 31j of QPP unit j is arranged as:

$$\Pi(i+(j-1)M)=(\Pi(i+(j-2)M)+f_1 M+(2j-3)f_2 M^2+2f_2 Mi) \bmod k \quad (3),$$

$$\Pi(i+(j-1)M+1)=(\Pi(i+(j-2)M+1)+f_1 M+(2j-3)f_2 M^2+2f_2 M(i+1))\bmod k \quad (4),$$

$$\Pi(i+(j-1)M+(r-1))=(\Pi(i+(j-2)M+(r-1)+f_1 M+(2j-3)f_2 M^2+2f_2 M(i+(r-1))\bmod k \quad (5)$$

According to equations (3), (4), (5), for $2 \leq j = L$, QPP unit j may compute in parallel the increasing interleaver addresses $\Pi(i+(j-1)M)$, $\Pi(i+(j-1)M+1)$, ..., $\Pi(i+(j-1), M+(r-1))$; similarly, for $2 \leq j \leq L$, QPP unit j may compute in parallel the decreasing interleaver addresses $\Pi(jM-i-1)$, $\Pi(jM-i-2)$, ..., $\Pi(jM-i-r)$. For MAP a processor with radix-$2^r$, M may be the memory length for the MAP processor to write to or read from. Hence, the original interleaving length k may be configured to the k/M interleaving lengths of M without the need to change the original decoder or processor circuit or structure.

Figure 4:
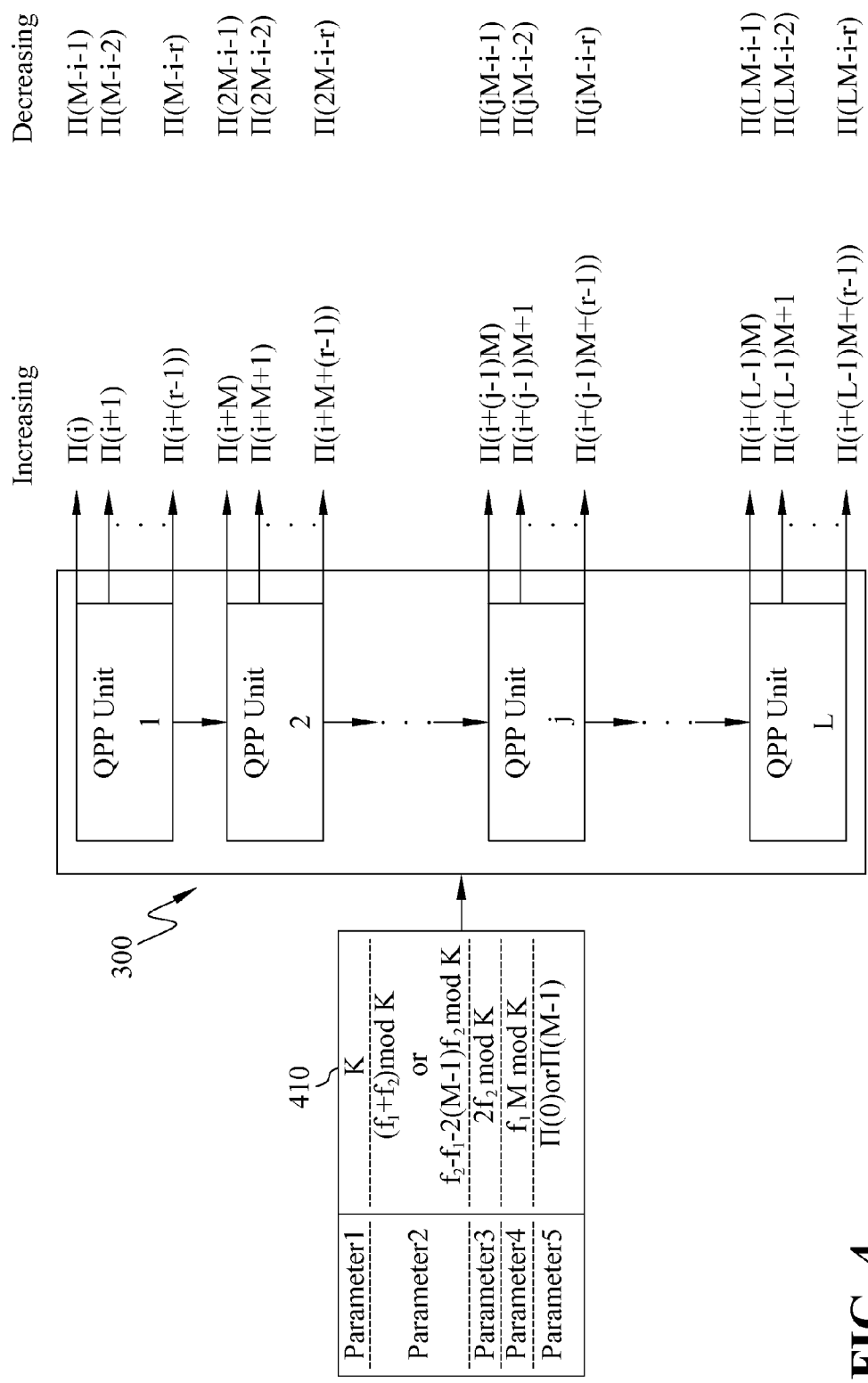
FIG. 4 shows an exemplary schematic view of a corresponding group of increasing interleaver addresses or decreasing interleaver addresses generated by each QPP unit of the QPP interleaver address generation apparatus, consistent with certain disclosed embodiments.

Accordingly, for a MAP processor with radix-$2^r$ r, FIG. 4 shows an exemplary schematic view of a corresponding group of increasing interleaver addresses or decreasing interleaver addresses generated by each QPP unit of the QPP interleaver address generation apparatus, consistent with certain disclosed embodiments. In FIG. 4, QPP interleaver address generation apparatus 300 may input several configurable parameters, marked as 410, such as parameters of k, $(f_1+f_2)$ mod k or $f_2-f_1-2(M-1)f_2$ mod k, $2f_2$ mod k, $f_1M$ mod k, $\Pi(0)$ or $\Pi(M-1)$, and uses the L QPP units to compute and output in parallel the interleaver addresses. Each QPP unit, $1 \leq j \leq L$, may follow the aforementioned equations to output in parallel a corresponding group (r) increasing interleaver addresses or a corresponding group (r) of decreasing interleaver addresses.

Figure 5A:
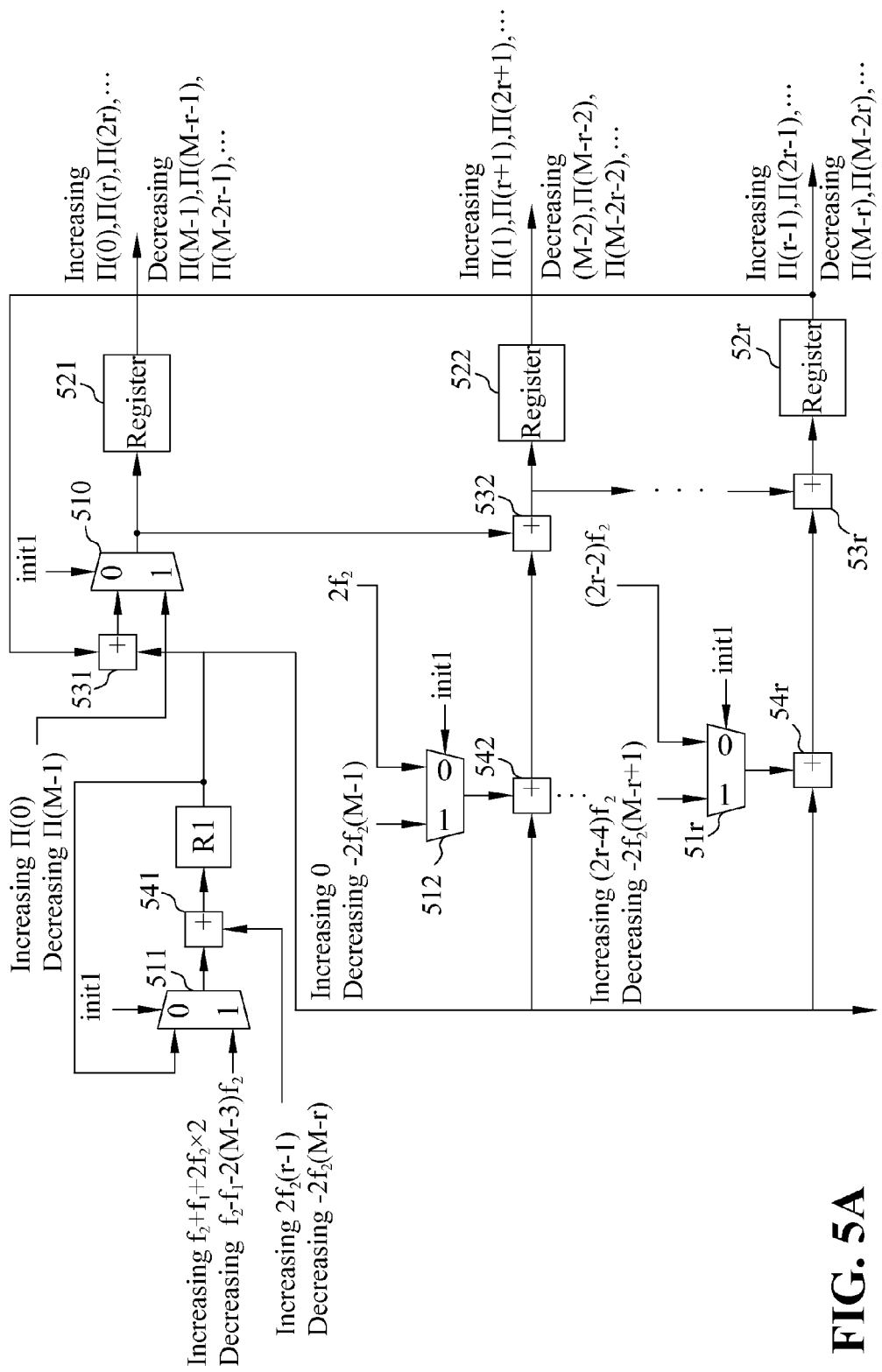
FIGS. 5A-5B show exemplary schematic views of hardware structure and control signal timing respectively of QPP unit 1 of FIG. 4, consistent with certain disclosed embodiments.
Figure 5B:
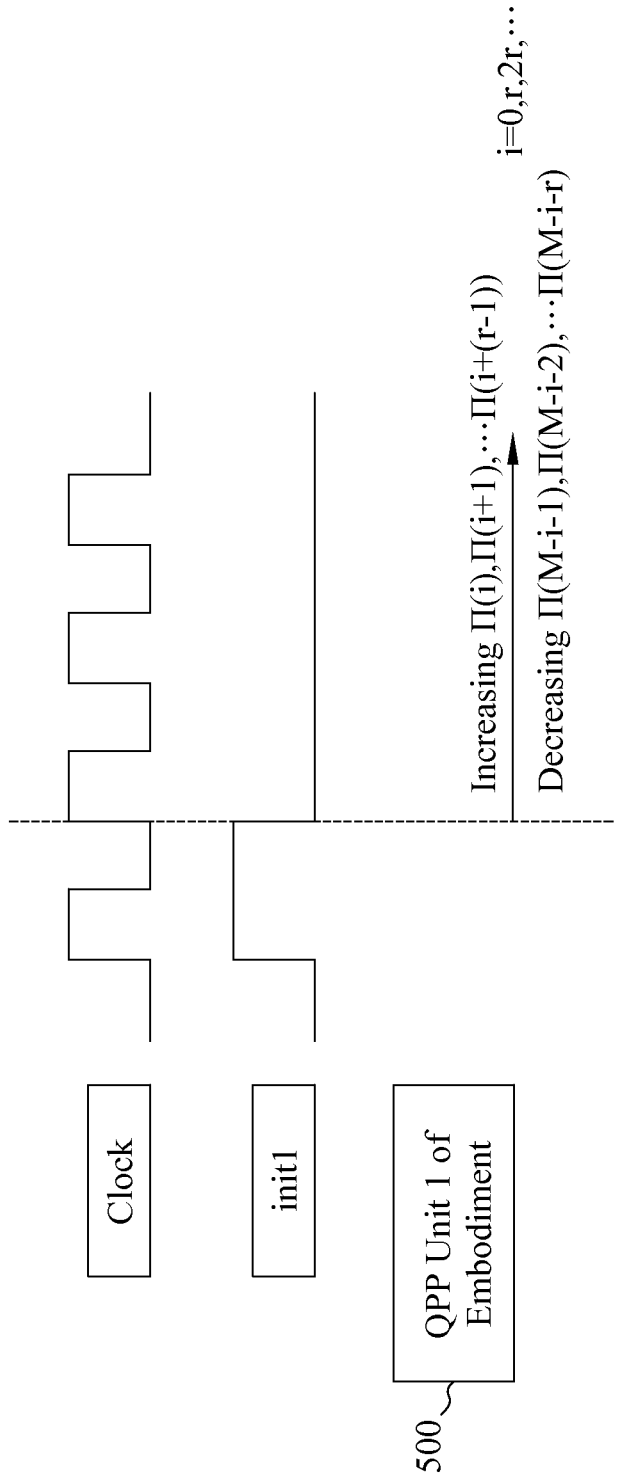

FIG. 5A and FIG. 5B show respectively the exemplary schematic views of the hardware structure and control signal timing of QPP unit 1 of FIG. 4, consistent with certain disclosed embodiments. Assume that the radix used by MAP processor is equal to $2^r$, in FIG. 5A, r+1 multiplexers 510-51r, r registers 521-52r and 2r 2-input-add-mod circuits, marked as 531-53r and 541-54r, may be used in combination with a control signal init1 to realize QPP unit 1. 2-input-add-mod circuit is a common remainder circuit, such as, two addition operands A and B, after addition, the remainder of divider K, i.e., (A+B) mod K, and may be realized by two adders and a multiplexer. FIG. 5B shows the control signal init1 timing sequence. The following description refers to FIG. 5A and FIG. 5B to explain the operation among the components of QPP unit 1.

According to the timing control in FIG. 5B, multiplexer 510 outputs increasing parameter $\Pi(0)$ or decreasing parameter $\Pi(M-1)$ to register 521 by triggering control signal init1 (i.e., init1=HIGH). At this point, multiplexer 511 also outputs increasing parameter $f_2+f_1+2f_2 \times 2$ or decreasing parameter $f_2-f_1-2(M-3)f_2$ to 2-input-add-mod circuit 541; multiplexer 512 outputs increasing parameter 0 or decreasing parameter $-2(M-1)f_2$ to 2-input-add-mod circuit 542; multiplexer 51r outputs increasing parameter $(2r-4)f_2$ or decreasing parameter $-2(M-r+1)f_2$ to 2-input-add-mod circuit 54r. When increasing parameter $\Pi(0)$ or decreasing parameter $\Pi(M-1)$ is outputted, the parameter is also outputted to 2-input-add-mod circuit 532.

The other input to 2-input-add-mod circuit 511 is increasing parameter $2(r-1)f_2$ or decreasing parameter $-2(M-r)f_2$. After 2-input-add-mod circuit 511 computes, the generated modulus result R1 is outputted to multiplexer 511 and 2-input-add-mod 531 and 542-54r, respectively. After 2-input-add-mod circuit 542 computes, the generated modulus result is outputted to multiplexer 513 and 2-input-add-mod 532, respectively. After 2-input-add-mod circuit 532 computes, the generated modulus result is outputted to register 522 and 2-input-add-mod 533 (not shown), respectively. After 2-input-add-mod circuit 54r computes, the generated modulus result is outputted to register 52r.

Accordingly, when init1 is HIGH, the r increasing interleaver addresses $\Pi(0)$-$\Pi(r-1)$, or the r decreasing interleaver addresses $\Pi(M-1)$-$\Pi(M-r)$ computed in parallel by the embodiment 500 of QPP unit 1 are stored into r registers 521-52r respectively. When the value stored in register 52r, i.e., $\Pi(r-1)$ or $\Pi(M-r)$, is outputted, the value is also outputted to 2-input-add-mod circuit 531.

Then, when the triggering edge of control signal init1 becomes LOW, QPP unit 1 in the embodiment 500 outputs the r interleaver addresses in registers 521-52r, i.e., $\Pi(0)$-$\Pi(r-1)$ or $\Pi(M-1)$-$\Pi(M-r)$. Because control signal init1 is LOW, multiplexer 510 outputs the computation result of 2-input-add-mod circuit 531, i.e., $\Pi(r)$ or $\Pi(M-r-1)$, to register 521. The computation result is also outputted to 2-input-add-mod circuit 532.

After the triggering edge of control signal init1 becomes LOW, the generated modulus result of 2-input-add-mod circuit 511 is the modulus result of the previous modulus result R1 and increasing parameter $2(r-1)f_2$ or decreasing parameter $-2(M-r)f_2$, and the new R1 result is outputted to multiplexer 511 and 2-input-add-mod 531 and 542-54r, respectively. Multiplexer 512 outputs parameter $2f_2$ to 2-input-add-mod circuit 542. After 2-input-add-mod circuit 542 computes, the generated modulus result is outputted to multiplexer 513 and 2-input-add-mod 532, respectively. After 2-input-add-mod circuit 532 computes, the generated modulus result, i.e., $\Pi(r+1)$-$\Pi(M-r-2)$ is outputted to register 522 and 2-input-add-mod 533, respectively. Multiplexer 51r outputs parameter $(2r-2)f_2$ to 2-input-add-mod circuit 54r. After 2-input-add-mod circuit 54r computes, the generated modulus result is outputted to 2-input-add-mod circuit 53r. After 2-input-add-mod circuit 532 computes, the generated modulus result, i.e., $\Pi(2r-1)$-$\Pi(M-2r)$ is outputted to register 52r. QPP unit 1 of embodiment 500 outputs the r interleaver addresses, i.e., $\Pi(r)$-$\Pi(2r-1)$ or $\Pi(M-r-1)$-$\Pi(M-2r)$, stored in r registers 521-52r. When the value stored in register 52r, i.e., $\Pi(2r-1)$ or $\Pi(M-2r)$, is outputted, the value is also outputted to 2-input-add-mod circuit 531.

In this manner, as shown in the embodiment of FIG. 5B, through the timing control of control signal init1, when the triggering edge of control signal init1 becomes LOW, when i=0, QPP unit 1 of embodiment 500 outputs the interleaver addresses stored in registers 521-52r as increasing interleaver addresses $\Pi(0)$-$\Pi(r-1)$ or decreasing interleaver addresses $\Pi(M-1)$-$\Pi(M-r)$; when i=r, QPP unit 1 of embodiment 500 outputs the interleaver addresses stored in registers 521-52r as increasing interleaver addresses $\Pi(r)$-$\Pi(2r-1)$ or decreasing interleaver addresses $\Pi(2M-1)$-$\Pi(2M-r)$; and so on. Therefore, according to the timing sequence, QPP unit 1 of embodiment 500 may output in parallel the increasing interleaver addresses $\Pi(0)$-$\Pi(r-1)$ or decreasing interleaver addresses $\Pi(M-1)$-$\Pi(M-r)$ first time; and for second time, QPP unit 1 of embodiment 500 may output in parallel the increasing interleaver addresses $\Pi(r)$-$\Pi(2r-1)$ or decreasing interleaver addresses $\Pi(M-r-1)$-$\Pi(M-2r)$; and so on.

In the embodiment of FIG. 5A, the modulus operation by K must be performed on all negative numbers to transform the original values into positive numbers between 0 and K−1, i.e., all the input signals must be positive numbers.

Figure 6:
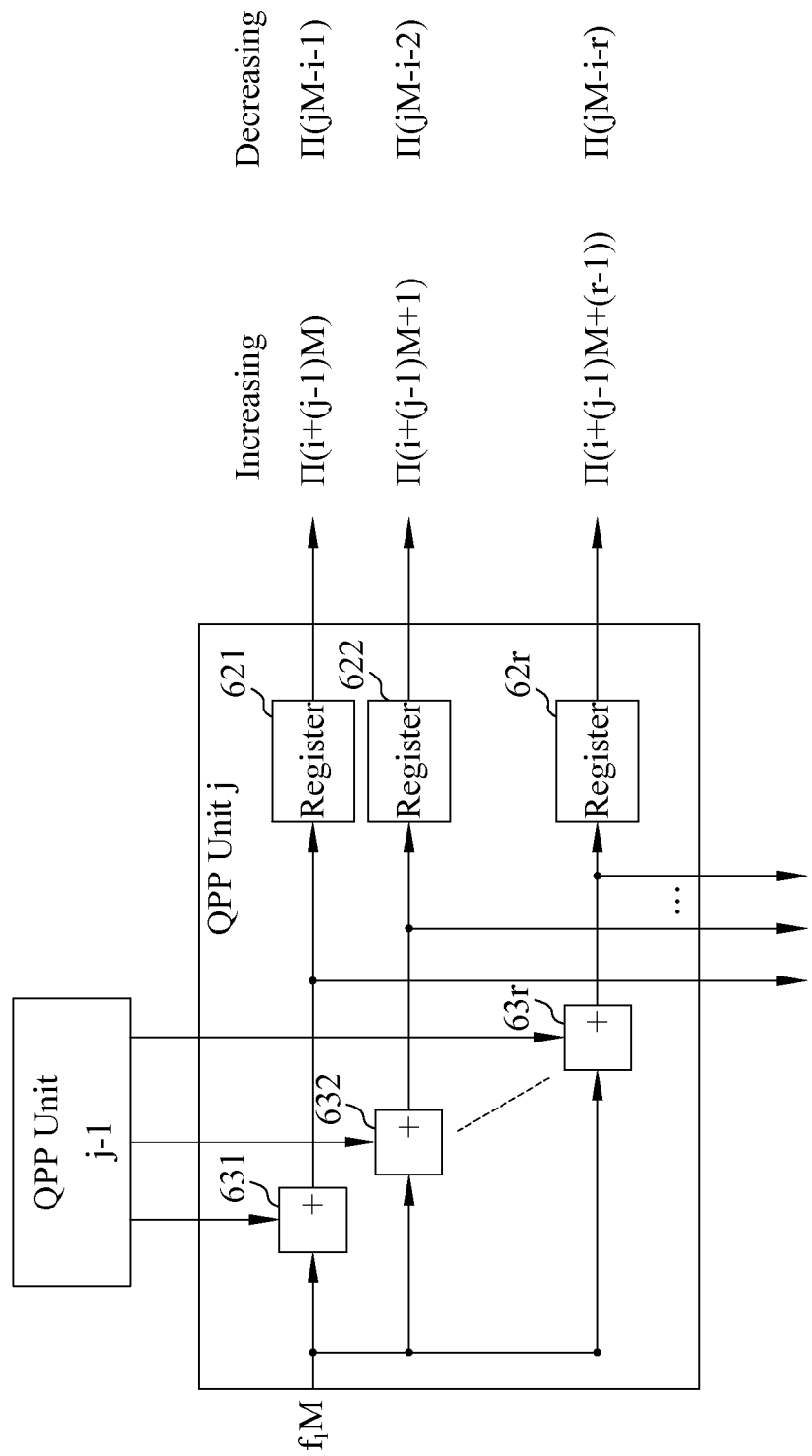
FIG. 6 shows an exemplary schematic view of hardware structure of QPP unit j of FIG. 4, $j \geq 2$, consistent with certain disclosed embodiments.

FIG. 6 shows an exemplary schematic view of hardware structure of QPP unit j of FIG. 4, $j \geq 2$, consistent with certain disclosed embodiments. In FIG. 6, assume that the radix used by MAP processor equals $2^r$, the hardware structure of QPP unit j may be realized by r registers 621-62r and r 2-input-add-mod circuits 631-63r, with input parameter $f_1M$. QPP unit j receives the computation result of previous QPP unit j−1, and computes and outputs in parallel r increasing interleaver addresses $\Pi(x+(j-1)M)$, $\Pi(x+(j-1)M+1)$, ..., $\Pi(x+(j-1)M+(r-1))$; the r decreasing interleaver addresses computed and outputted in parallel are $\Pi(jM-x-1)$, $\Pi(jM-x-2)$, ..., $\Pi(jM-x-r)$, where x=0, r, 2r, ..., M-r. Similarly, these increasing or decreasing interleaver addresses will also be outputted to the next QPP unit j+1.

According to the aforementioned equations for interleaver address computation, the hardware structure of QPP unit 1 may be designed according to the input increasing or decreasing parameter, in combination with different control signals, and outputs in parallel the corresponding group of increasing interleaver addresses 311 or decreasing interleaver addresses 321, as described by the following two working examples.

Figure 7A:
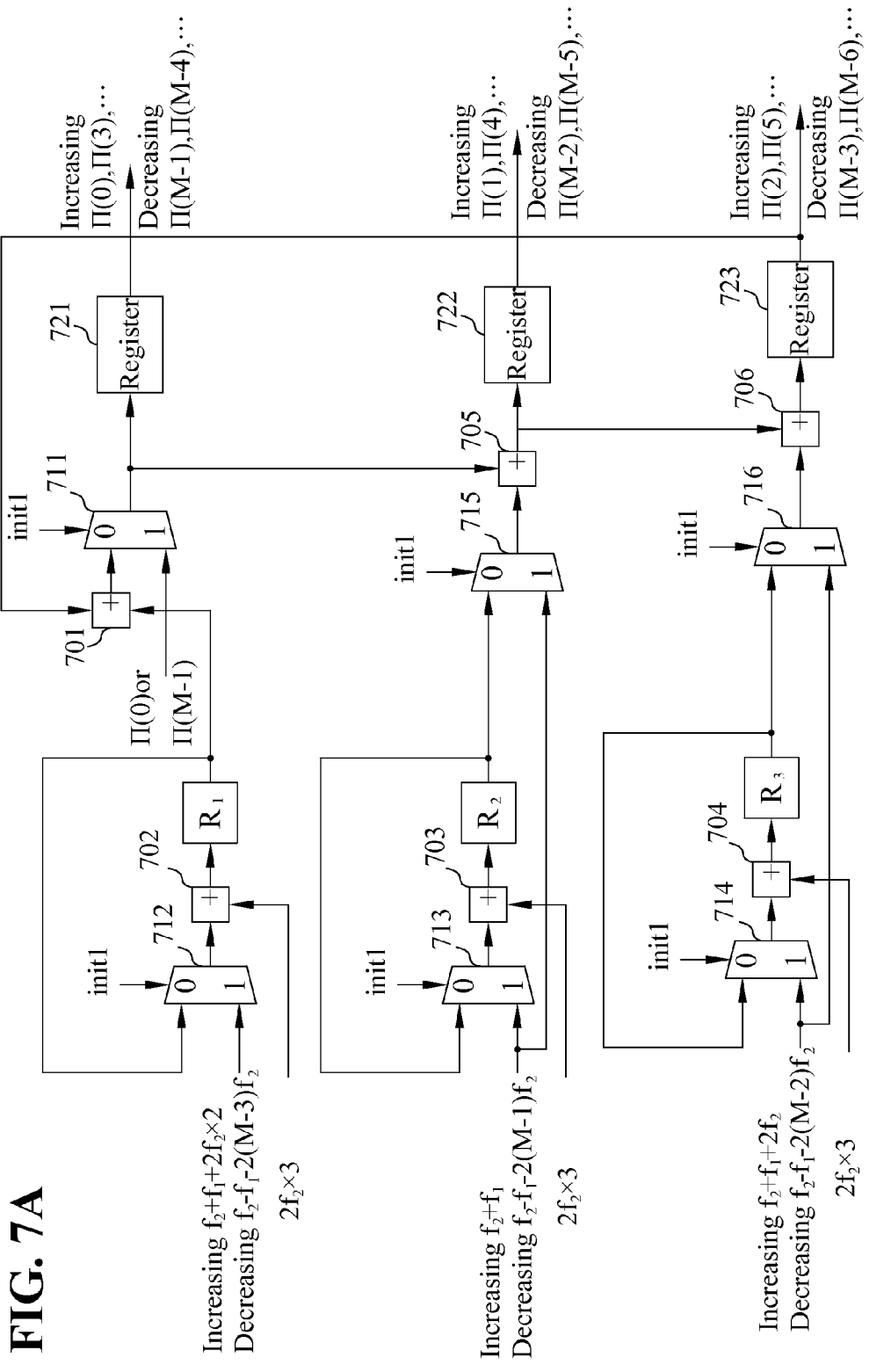
FIG. 7A shows an exemplary schematic view of a working example of the hardware structure of QPP unit 1, where MAP processor uses radix=$2^3$, consistent with certain disclosed embodiments.

FIG. 7A shows an exemplary schematic view of a working example of the hardware structure of QPP unit 1, consistent with certain disclosed embodiments, where MAP processor uses radix=$2^3$. QPP unit 1 of working example 700 in FIG. 7A may be realized with six multiplexers 711-716, three registers 721-723, and six 2-input-add-mod circuits 701-706, in combination with a control signal init1. First, through triggering control signal init1 (i.e., init1=HIGH), multiplexer 711 outputs increasing parameter $\Pi(0)$ or decreasing parameter $\Pi(M-1)$ to register 721; at this point, multiplexer 712 also outputs increasing parameter $f_2+f_1+2f_2\times 2$ or decreasing parameter $f_2-f_1-2(M-3)f_2$ to 2-input-add-mod circuit 702; multiplexer 713 also outputs increasing parameter $f_2+f_1$ or decreasing parameter $f_2-f_1-2(M-1)f_2$ to 2-input-add-mod circuit 703; multiplexer 714 also outputs increasing parameter $f_2+f_1+2f_2$ or decreasing parameter $f_2-f_1-2(M-2)f_2$ to 2-input-add-mod circuit 704. When increasing parameter $\Pi(0)$ or decreasing parameter $\Pi(M-1)$ is outputted, the parameter, i.e., increasing parameter $\Pi(0)$ or decreasing parameter $\Pi(M-1)$, is also outputted to 2-input-add-mod circuit 705.

The other inputs to 2-input-add-mod circuits 702-704 are all parameter $2f_2\times 3$. After 2-input-add-mod circuit 702 computes, the generated modulus result R1 is outputted to multiplexer 712 and 2-input-add-mod 701, respectively. After 2-input-add-mod circuit 703 computes, the generated modulus result R2 is outputted to multiplexer 713 and multiplexer 715, respectively. After 2-input-add-mod circuit 703 computes, the generated modulus result R2 is outputted to multiplexer 713 and multiplexer 715, respectively. After 2-input-add-mod circuit 704 computes, the generated modulus result R3 is outputted to multiplexer 714 and multiplexer 716, respectively.

When init1=HIGH, multiplexer 715 outputs the input parameter $2f_2\times 3$ to 2-input-add-mod circuit 705 and multiplexer 716 outputs the input parameter $2f_2\times 3$ to 2-input-add-mod circuit 706. After 2-input-add-mod circuit 705 computes, the generated modulus result, i.e., $\Pi(1)$ or $\Pi(M-2)$, will be outputted to register 722 and 2-input-add-mod circuit 706, respectively. After 2-input-add-mod circuit 706 computes, the generated modulus result, i.e., $\Pi(2)$ or $\Pi(M-3)$, will be outputted to register 723 and 2-input-add-mod circuit 701, respectively.

Accordingly, when init1 is HIGH, the three increasing interleaver addresses $\Pi(0)-\Pi(2)$, or the three decreasing interleaver addresses $\Pi(M-1)-\Pi(M-3)$ computed in parallel by the QPP unit 1 of working example 700 are stored into three registers 721-723, respectively.

Then, when the triggering edge of control signal init1 becomes LOW, multiplexer 711 outputs the modulus result generated by 2-input-add-mod circuit 701 to register 721, where one input of 2-input-add-mod circuit 701 is increasing parameter $\Pi(2)$ or decreasing parameter $\Pi(M-3)$, and the other input of 2-input-add-mod circuit 701 is the modulus result generated by 2-input-add-mod circuit 702. The modulus result generated by 2-input-add-mod circuit 702 is the modulus result of the previous modulus result R1 and input parameter $2f_2\times 3$. After 2-input-add-mod circuit 701 computes, the generated modulus result, i.e., increasing parameter $\Pi(3)$ or decreasing parameter $\Pi(M-4)$, is outputted to 2-input-add-mod circuit 705 as well as register 721.

Similarly, the modulus result generated by 2-input-add-mod circuit 703 is the modulus result of the previous modulus result R2 and input parameter $2f_2\times 3$, and is outputted by multiplexer 715 to 2-input-add-mod circuit 705; the modulus result generated by 2-input-add-mod circuit 704 is the modulus result of the previous modulus result R3 and input parameter $2f_2\times 3$, and is outputted by multiplexer 716 to 2-input-add-mod circuit 706.

After 2-input-add-mod circuit 705 computes, the generated modulus result, i.e., $\Pi(4)$ or decreasing parameter $\Pi(M-5)$, is outputted to register 722 and 2-input-add-mod circuit 706, respectively. After 2-input-add-mod circuit 706 computes, the generated modulus result, i.e., $\Pi(5)$ or decreasing parameter $\Pi(M-6)$, is outputted to register 723 and 2-input-add-mod circuit 701, respectively.

Figure 7B:
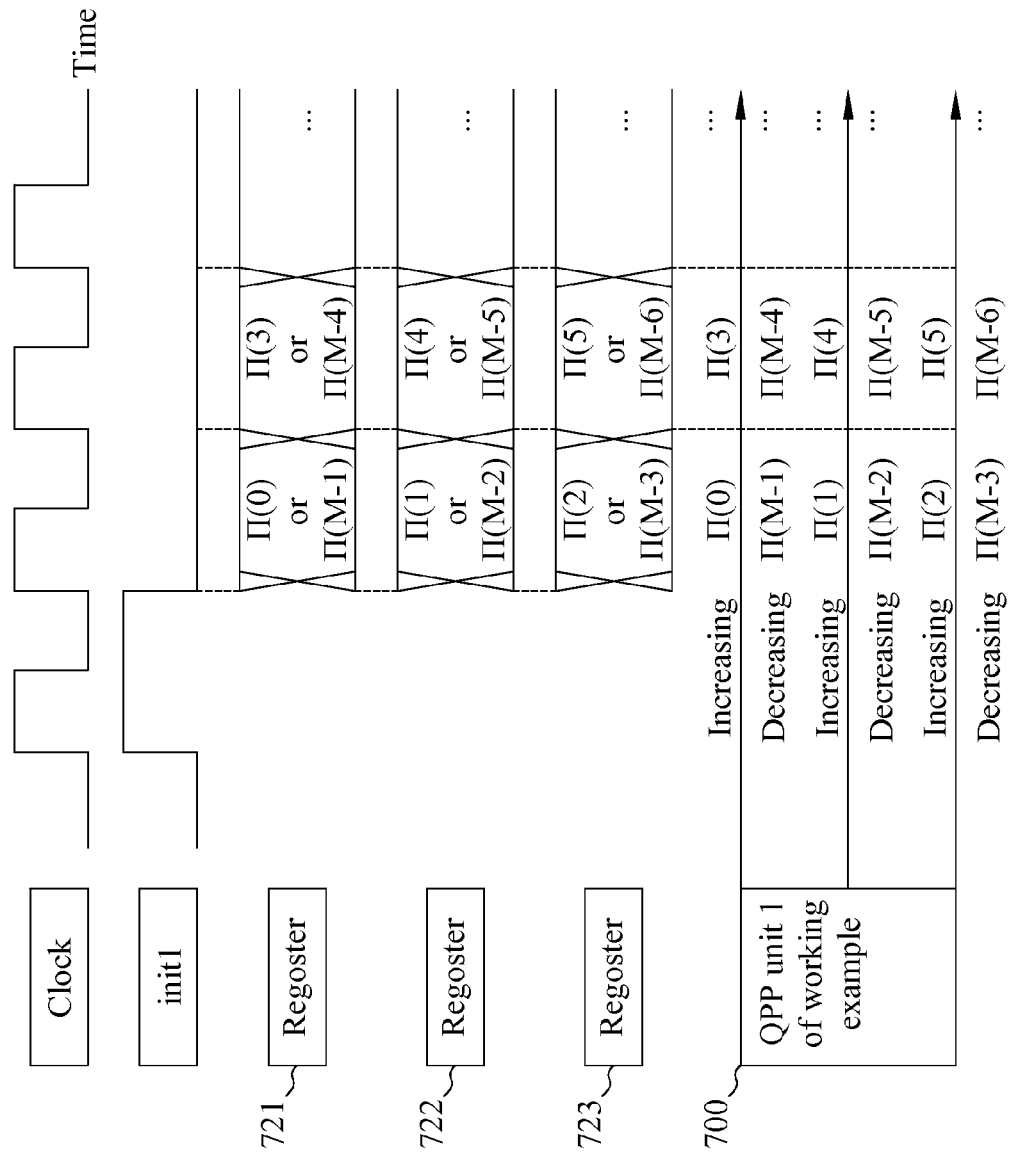
FIG. 7B shows an exemplary schematic view of the control signal timing sequence of the QPP unit 1 of FIG. 7A, consistent with certain disclosed embodiments.

Accordingly, as shown in the example of FIG. 7B, through the timing control of control signal init1, when the triggering edge of control signal init1 becomes LOW, for the first time, registers 721-723 store either increasing interleaver addresses $\Pi(0)$, $\Pi(1)$, $\Pi(2)$ or decreasing interleaver addresses $\Pi(M-1)$, $\Pi(M-2)$, $\Pi(M-3)$; and for the second time, registers 721-723 store either increasing interleaver addresses $\Pi(3)$, $\Pi(4)$, $\Pi(5)$ or decreasing interleaver addresses $\Pi(M-4)$, $\Pi(M-5)$, $\Pi(M-6)$; and so on. Therefore, according to the timing sequence, QPP unit 1 of working example 700 may output in parallel the increasing interleaver addresses $\Pi(0)$, $\Pi(1)$, $\Pi(2)$ or decreasing interleaver addresses $\Pi(M-1)$, $\Pi(M-2)$, $\Pi(M-3)$ for the first time; and for second time, QPP unit 1 of working example 700 may output in parallel the increasing interleaver addresses $\Pi(3)$, $\Pi(4)$, $\Pi(5)$ or decreasing interleaver addresses $\Pi(M-4)$, $\Pi(M-5)$, $\Pi(M-6)$; and so on.

Figure 8:
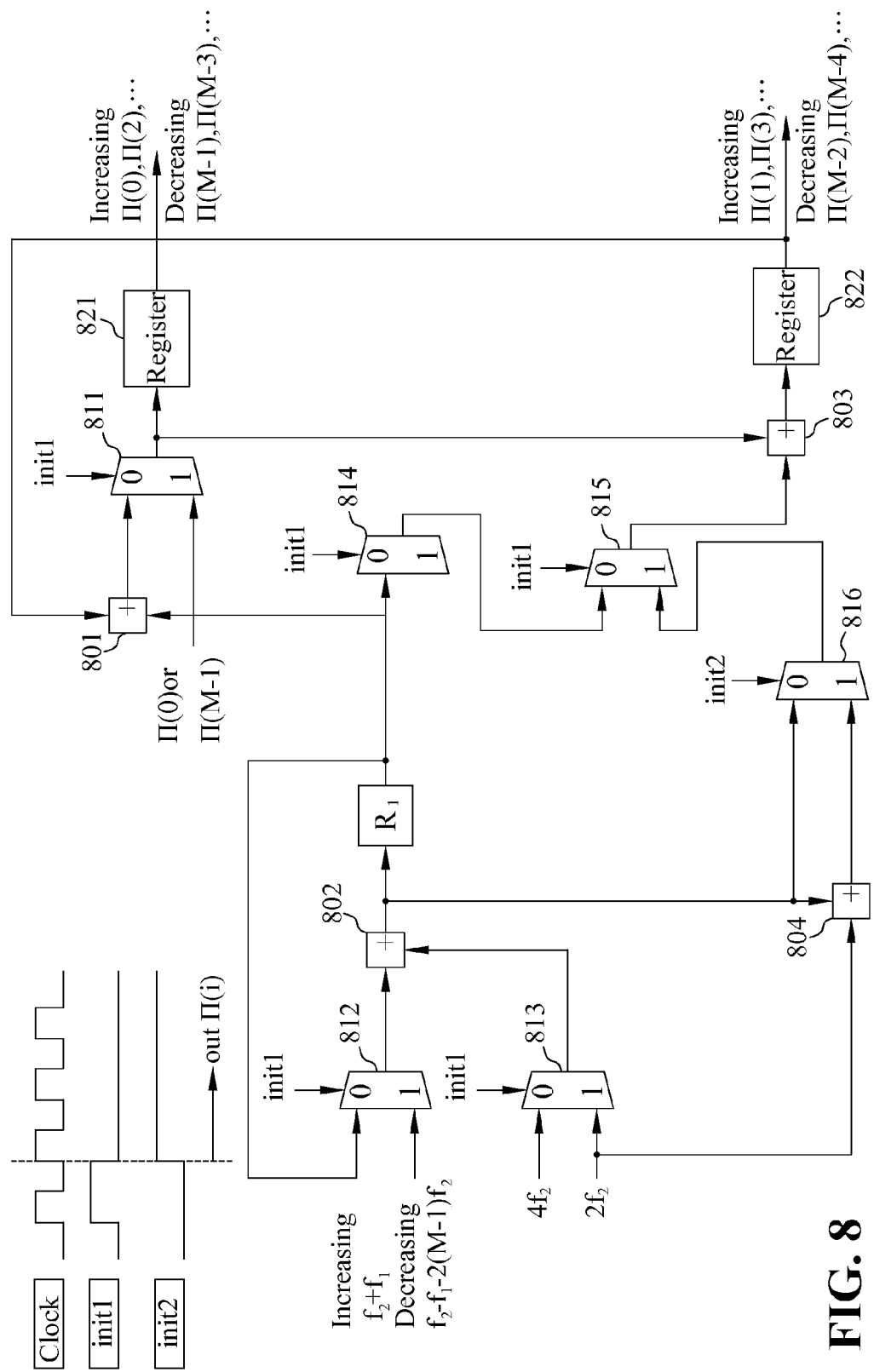
FIG. 8 shows another working example of hardware structure of QPP unit 1, where MAP processor uses radix=$2^2$, consistent with certain disclosed embodiments.

FIG. 8 shows another working example of hardware structure of QPP unit 1, consistent with certain disclosed embodiments, where MAP processor uses radix=$2^2$. QPP unit 1 of working example 800 may be realized with six multiplexers 811-816, two registers 821-822, and three 2-input-add-mod circuits 801-803, a 2-input-sub-mod circuit 804, in combination with two control signals init1, init2. Registers 821-822 are controlled by the timing sequence of control signals init1, init2. After the triggering edge of control signal mitt becomes LOW and triggers control signal init2, for the first time, registers 821-822 store either increasing interleaver addresses $\Pi(0)$, $\Pi(1)$ or decreasing interleaver addresses $\Pi(M-1)$, $\Pi(M-2)$); and for the second time, registers 821-822 store either increasing interleaver addresses $\Pi(2)$, $\Pi(3)$ or decreasing interleaver addresses $\Pi(M-3)$, $\Pi(M-4)$; and so on.

In comparison with the working example in FIG. 7A, QPP unit 1 of working example 800 is different in the increasing parameter and the decreasing parameter input, in combination with the two control signals, and 2-input-add-mod circuits and 2-input-sub-mod circuits to realize the hardware structure of QPP unit 1, wherein control signal init1 is triggered first to set the output of multiplexers 811-815; when the triggering edge of control signal init1 becomes LOW, multiplexers 816 is set by triggering control signal init2 to output the modulus result generated by 2-input-sub-mod circuit 804 to multiplexer 815.

In the aforementioned hardware structure designs of QPP unit 1 of FIG. 5A, FIG. 7A and FIG. 8, the hardware structure design of QPP unit 1 in FIG. 5A is the most compact design for MAP processors using the same radix ($2^n$), where the hardware structure design of FIG. 5A uses less multiplexers and only one control signal.

Figure 9:
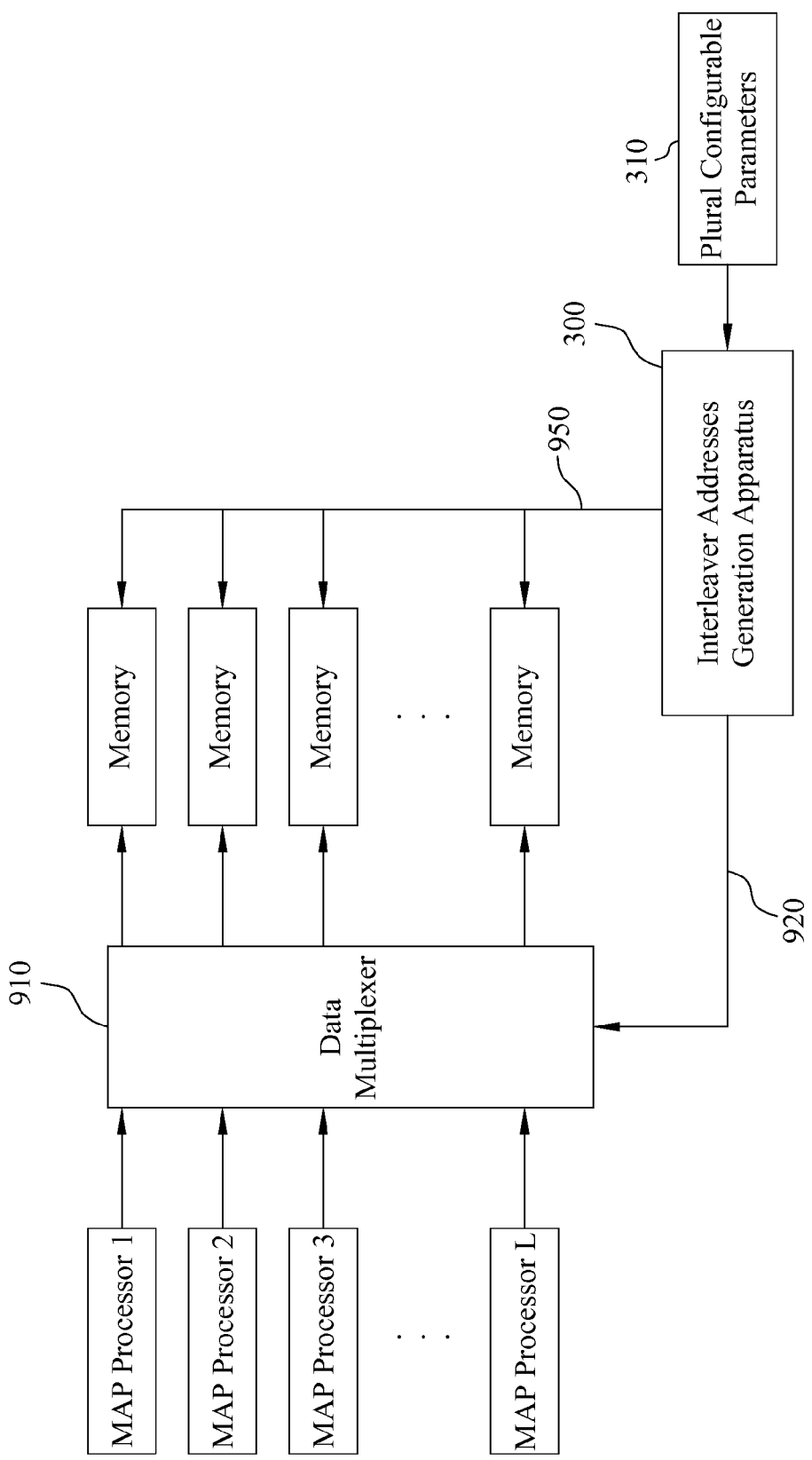
FIG. 9 shows an exemplary schematic view illustrating how QPP interleaver address generation apparatus may enable a plurality of MAP processors to output in parallel a plurality of data to memory, consistent with certain disclosed embodiments.

If the data length processed by each MAP processor is M, i.e., the sliding window width, and M is the power of 2, such as, $M=2^n$, the n least significant bits (LSB) of the computed interleaver address may be used as the memory address to be written with data processed by MAP processor. FIG. 9 shows an exemplary schematic view illustrating how QPP interleaver address generation apparatus may allow a plurality of MAP processors to output in parallel a plurality of data to memory, consistent with certain disclosed embodiments.

Referring to FIG. 9, QPP interleaver address generation apparatus 300 generates interleaver addresses Π(i), Π(i+M), Π(i+2M), . . . , Π(i+(L−1)M), and outputs memory selection information 920 to a data multiplexer 910. Memory selection information is information on partial bits of Π(i), Π(i+M), Π(i+2M), . . . , Π(i+(L−1)M), such as, information on the n most significant bits (MSB) of Π(i), Π(i+M), Π(i+2M), . . . , Π(i+(L−1)M). After data multiplexer 910 receives L data outputted in parallel by a plurality of MAP processors, such as, MAP processor 1- MAP processor L, $M=2^n$, and memory selection information 920 from QPP interleaver address generation apparatus 300, data multiplexer 910 will output each of the L data to a corresponding memory address 950 of the selected memory. These corresponding memory addresses may be obtained directly from the interleaver address Π(i) computed by QPP interleaver address generation apparatus 300, such as, the information on n least significant bits (LSB) of the interleaver address Π(i).

Figure 10:
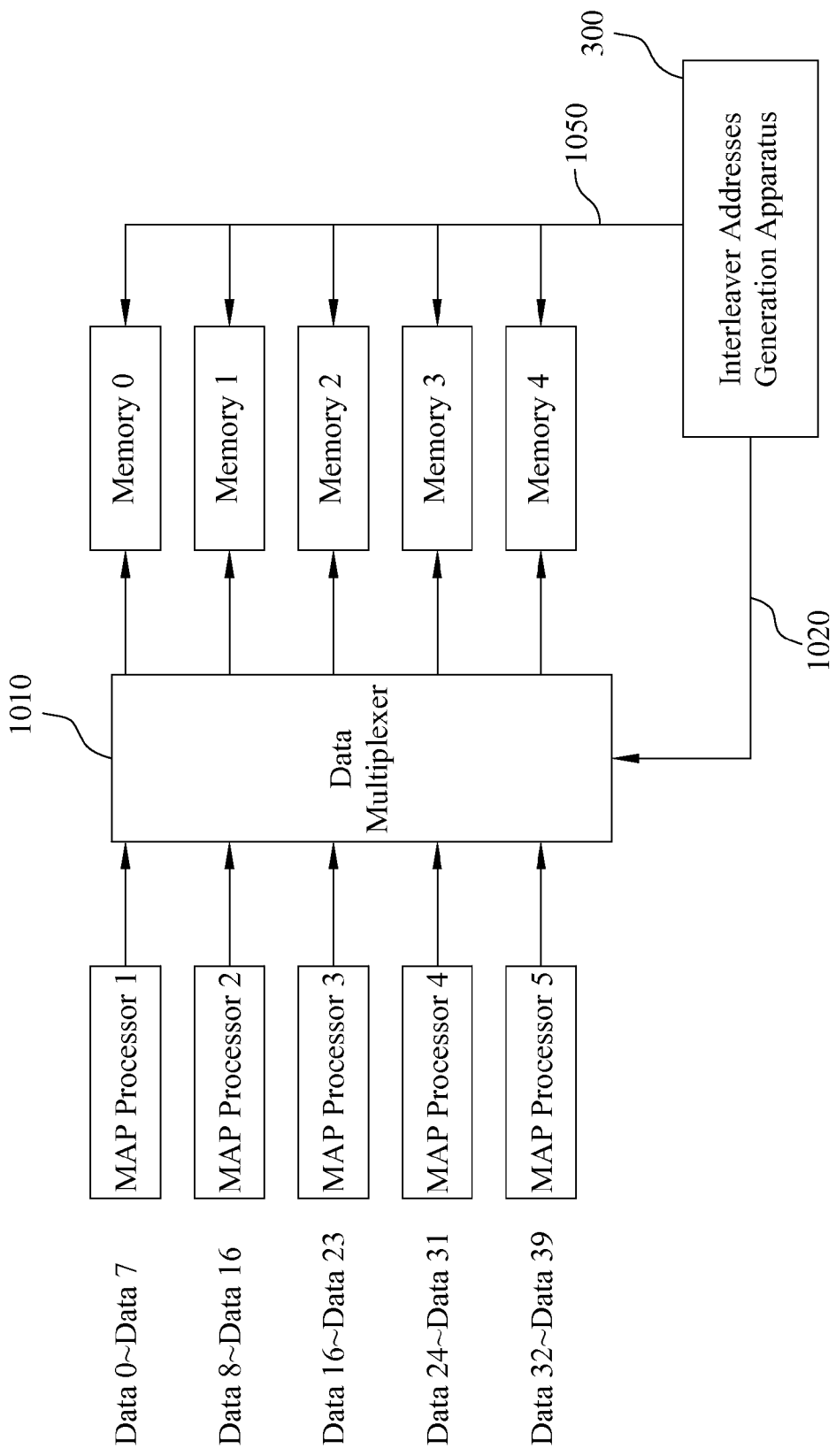
FIG. 10 shows a working example illustrating how QPP interleaver address generation apparatus may enable the 40 data outputted in parallel by five MAP processors to be stored to memory, consistent with certain disclosed embodiments.

Take k=40, $M=8=2^3$ as example. FIG. 10 shows an exemplary schematic view of how QPP interleaver address generation apparatus 300 enables five MAP processors, such as, MAP processor 1- MAP processor 5, to store 40 data into the memory addresses generated by QPP interleaver address generation apparatus 300. In FIG. 10, the data length processed by each MAP processor is $M=40/5=8=2^3$, such as, MAP processor 1 processing data 0 to data 7, MAP processor 2 processing data 8 to data 15, MAP processor 3 processing data 16 to data 23, MAP processor 4 processing data 24 to data 31, and MAP processor 5 processing data 32 to data 39.

When QPP interleaver address generation apparatus 300 computes in parallel interleaver addresses Π(i), Π(i+8), Π(i+16), Π(i+24), Π(i+32), QPP interleaver address generation apparatus 300 also outputs information 1020 on the MSB 3 bits of Π(i), Π(i+8), Π(i+16), Π(i+24), Π(i+32) to data multiplexer 1010 at the same time. After data multiplexer 1010 simultaneously receives the five data outputted by MAP processor 1- MAP process 5 using the same Radix-8 ($=2^3$), and information 1020 on the MSB 3 bits of Π(i+8), Π(i+16), Π(i+32), data multiplexer 1010 outputs the five data in parallel to the memory addresses of five different memories, such as memory 0 to memory 4. The five memories are determined by information 1020 on the MSB 3 bits of Π(i), Π(i+8), Π(i+16), Π(i+24), Π(i+32), and the memory addresses to be written into are determined by information 1050 on the LSB 3 bits of Π(i), Π(i+8), Π(i+16), Π(i+24), Π(i+32). In other words, the five data are outputted in parallel to five different memories and the five memories use the same memory address to store the data respectively. In this manner, from i=0 to i=7, MAP processor 1- MAP processor 5 output 40 data in parallel totally, and the data are stored into the memory addresses of the five different memories.

Figure 11:
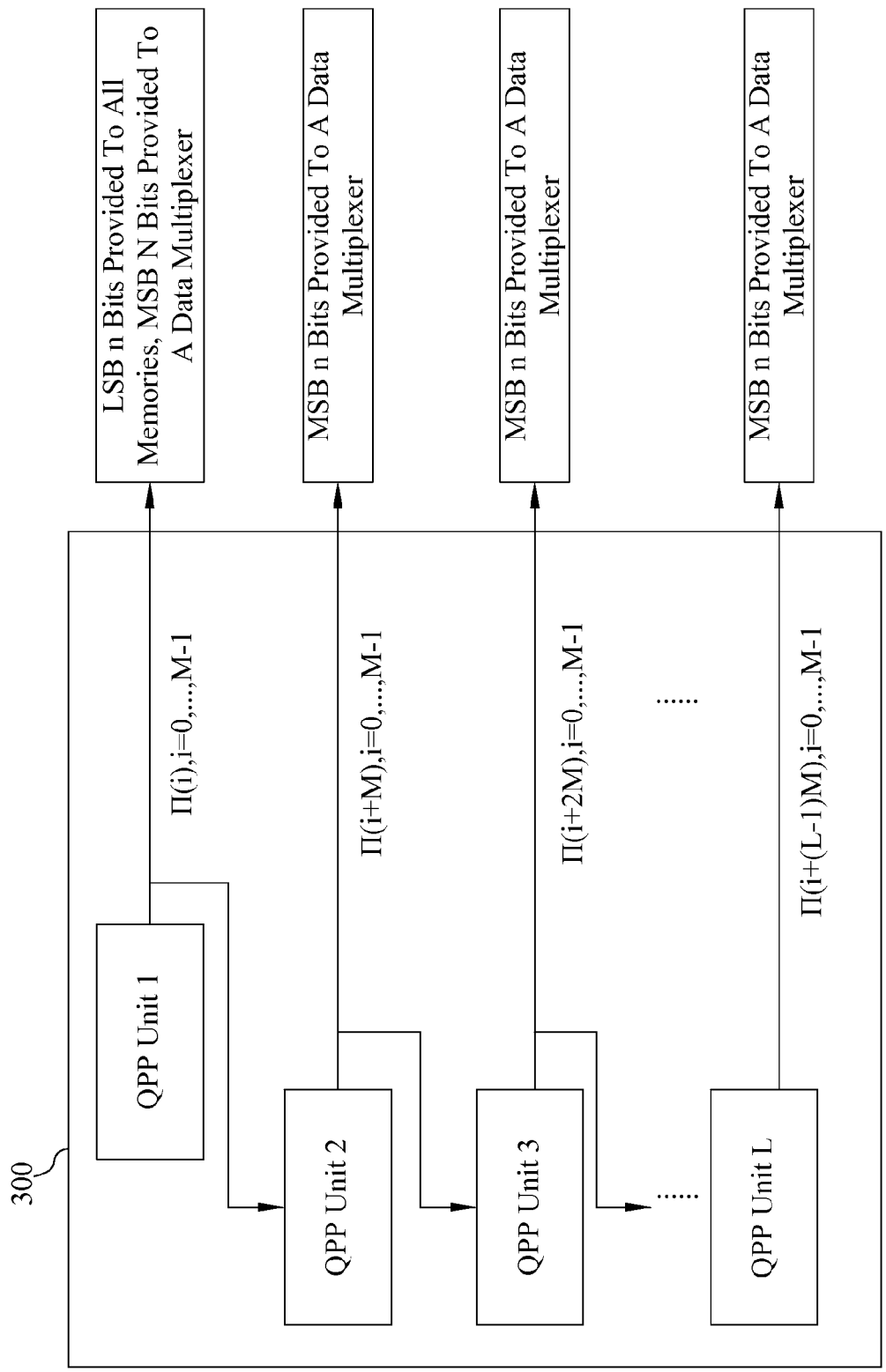
FIG. 11 shows the usage of the bits of the interleaver address computed by each QPP unit in QPP interleaver address generation apparatus, consistent with certain disclosed embodiments.

In other words, when $M=2^1$, as shown in the exemplary embodiment of QPP interleaver address generation apparatus of FIG. 11, the LSB n bits of the interleaver address Π(i) computed by QPP unit 1 are provided as addresses to all the memories, and the MSB n bits of the interleaver address Π(i+jM) computed by each QPP unit j, j=1, . . . , L, are provided to a data multiplexer, such as a data multiplexer of a MAP processor, to select a memory. n may be seen as the number of bits of the address buses of the memory. In other words, each memory has $2^n$ memory addresses. The MSB n bits of the interleaver addresses computed by L QPP units, i.e., Π(i), Π(i+M), . . . , Π(i+(L−1)M), may be mapped to L MAP processors to select the memory for the processed data to write into.

FIG. 12 shows an exemplary table of how QPP interleaver address generation apparatus computes interleaver addresses and determines memory addresses, consistent with certain disclosed embodiments. Assume that Π(0)=0, L=K/M=5, in QPP interleaver address generation apparatus 300, when i=0, QPP unit 1 to QPP unit 5 compute the following interleaver addresses respectively:

$$\Pi(0)=0=(000000)_2, \Pi(8)=24=(011000)_2,$$

$$\Pi(16)=8=(001000)_2, \Pi(24)=32=(100000)_2,$$

$$\Pi(32)=16=(010000)_2.$$

Because the MSB 3 bits of Π(0), Π(8), Π(16), Π(24), Π(32) are 000, 011, 001, 100, 010, respectively, and the LSB 3 bits of Π(0) is 000, therefore, for the first time, the five data (i.e., data 0, data 8, data 16, data 24, data 32) outputted in parallel by five MAP processors (MAP processor 1- MAP processor 5) are written to the address 0 of memory 0, address 0 of memory 3, address 0 of memory 1, address 0 of memory 4 and address 0 of memory 2, respectively.

When i=1, QPP unit 1 to QPP unit 5 compute the following interleaver addresses respectively:

$$\Pi(1)=13=(001101)_2, \Pi(9)=37=(100101)_2,$$

$$\Pi(17)=21=(010101)_2, \Pi(25)=5=(000101)_2,$$

$$\Pi(33)=29=(011101)_2.$$

Because the MSB 3 bits of Π(1), Π(9), Π(17), Π(25), Π(33) are 001, 100, 010, 000, 011, respectively, and the LSB 3 bits of Π(1) is 101, therefore, for the second time, the five data (i.e., data 1, data 9, data 17, data 25, data 33) outputted in parallel by five MAP processors (MAP processor 1 to MAP processor 5) are written to the address 5 of memory 1, address 5 of memory 4, address 5 of memory 2, address 5 of memory 0 and address 5 of memory 3, respectively; and so on.

When i=7, $\Pi(7)=31=(011111)_2$, for the last time, the five data outputted in parallel by five MAP processors (MAP processor 1 to MAP processor 5) are written to the address 7 of the five memories according to the MSB 3 bits of the interleaver address computed by MAP processor 1- MAP processor. In this example, each memory includes 8 addresses, i.e., address 0 to address 7, so that 8 data outputted by each of Map processors may be written into the 8 addresses of a corresponding memory.

As seen in the exemplary table of FIG. 12, for the number of data processed by each MAP processor (in this case M=8, i.e., the width of the sliding window of the input sequence), the computation does not need complicated circuit, such as, multiplier, and the five data outputted in parallel by MAP processor 1 to MAP processor 5 are written to the same address of memory 0 to memory 4.

The above exemplar shows that when the radix used by MAP processor is $R(=2^r)$, the r interleaver addresses computed by each QPP unit j are mapped to the radix-$R(=2^r)$ architecture used by each MAP processor. In addition, assume that the data length processed by each MAP processor is $M=2^n$, the LSB n bits of the interleaver addresses computed by QPP unit 1 may be used as the memory address to write into.

Figure 13:
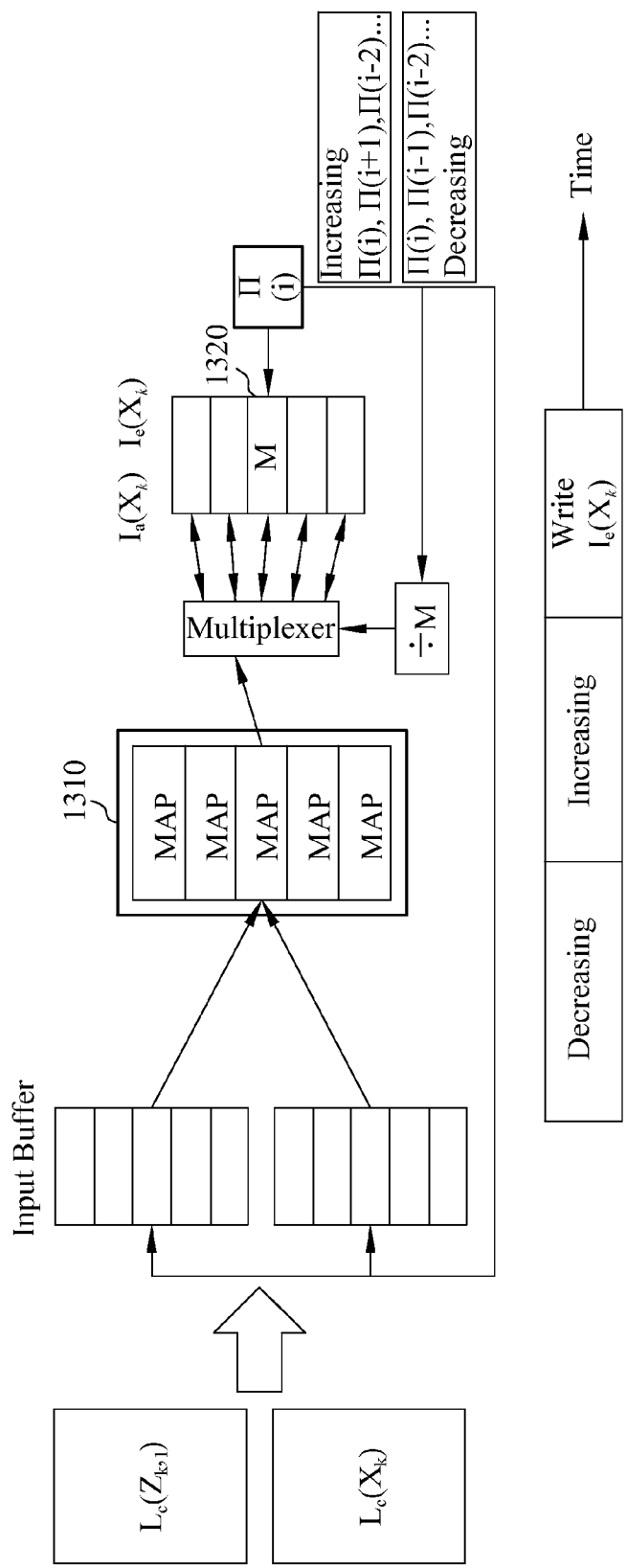
FIG. 13 shows an exemplary schematic view illustrating how QPP interleaver address generation apparatus generates corresponding increasing or decreasing interleaver addresses to correspond to the increasing or decreasing metric computation of MAP processor, consistent with certain disclosed embodiments.

Furthermore, for a MAP processor using different radix, QPP interleaver address generation apparatus 300 may generate corresponding increasing or decreasing interleaver addresses to correspond to the increasing or decreasing metric computation of the MAP processor, as shown in the example of FIG. 13. When a MAP of soft-input and soft-output (SISO) unit 1310 reads the increasing input signal or decreasing input signal $L_e(Z_{k,1})$, $I_a(x_k)$ and $L_e(x_k)$, QPP interleaver address generation apparatus 300 will generate increasing interleaver addresses or decreasing interleaver addresses $\Pi(i)$ for different memories to read corresponding $L_e(Z_{k,1})$, $I_a(x_k)$ and $L_e(x_k)$ used as input signal of the MAP. When the MAP starts to output $I_e(x_k)$, QPP interleaver address generation apparatus 300 may also generate corresponding interleaver address to provide the MAP to write computation result into a memory 1320, where M is the address size of the memory.

Figure 14:
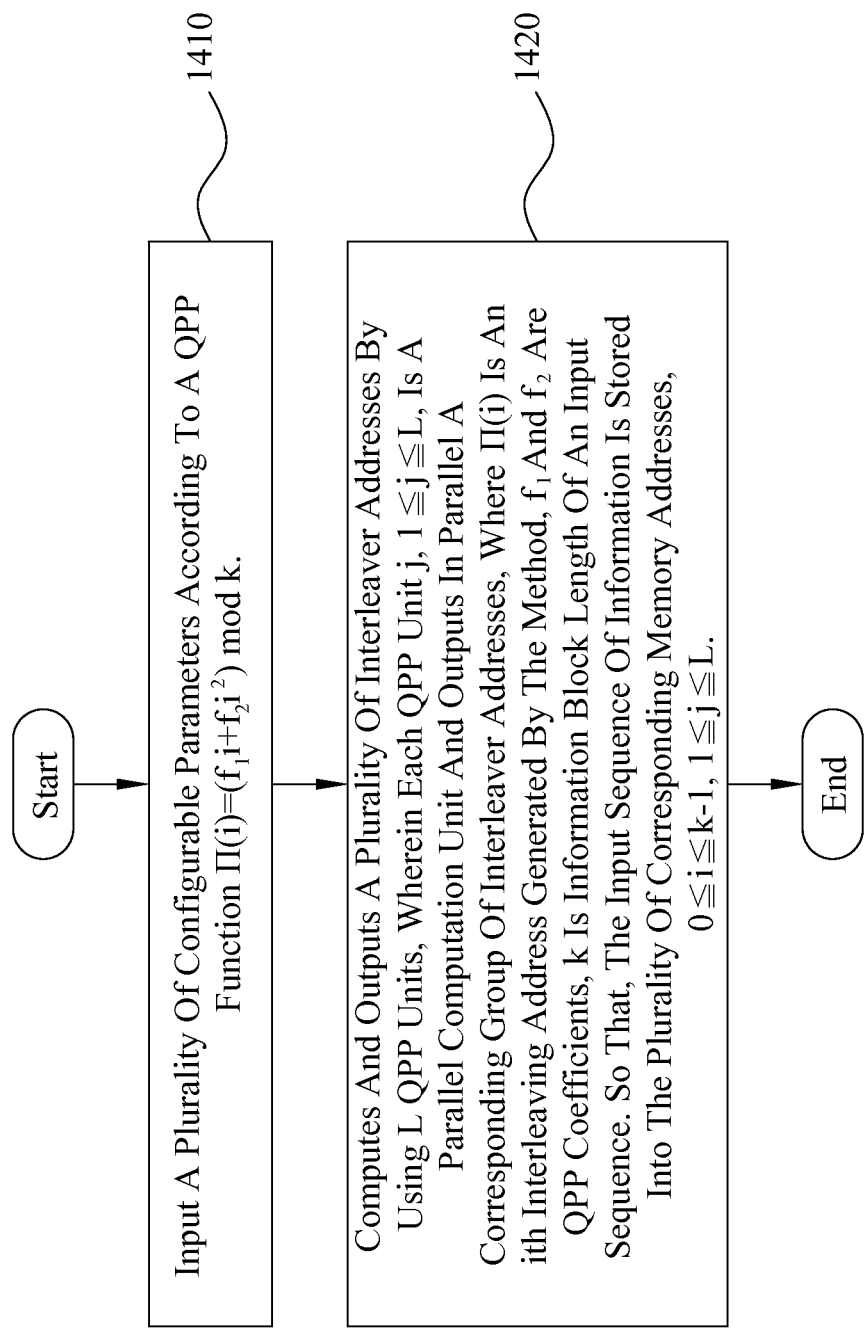
FIG. 14 shows an exemplary flowchart of an address generation method for QPP interleaver, consistent with certain disclosed embodiments.

Accordingly, FIG. 14 shows an exemplary flowchart of an address generation method for QPP interleaver, consistent with certain disclosed embodiments. Referring to FIG. 14, it may start with inputting a plurality of configurable parameters according to a QPP function $\Pi(i)=(f_1 i + f_2 i^2) \bmod k$, as shown in step 1410. In step 1420, it computes and outputs a plurality of interleaver addresses by using L QPP units, wherein each QPP unit j, $1 \leq j \leq L$, is a parallel computation unit and outputs in parallel a corresponding group of interleaver addresses, where $\Pi(i)$ is an $i^{th}$ interleaving address generated by the method, $f_1$ and $f_2$ are QPP coefficients, k is information block length of an input sequence. So that, the input sequence of information is stored into the plurality of corresponding memory addresses, $0 \leq i \leq k-1$, $1 \leq j \leq L$. The input sequence of information may be outputted in parallel through L sliding windows, and M is the width of each of the L sliding windows. The group of interleaver addresses outputted by each QPP unit j in parallel may be either a group of increasing interleaver addresses or a group of decreasing interleaver addresses.

In step 1420, each QPP unit j may compute a corresponding group of increasing interleaver addresses or a group of decreasing interleaver addresses in parallel according to the aforementioned equations (1)-(5), and the description is omitted here.

When $M=2^n$, as shown in exemplars of FIG. 11 and FIG. 12, the LSB n bits of interleaver address $\Pi(i)$ computed by QPP unit 1 may be used as the memory address, and the MSB n bits of interleaver address $\Pi(i+(j-1)M)$ computed by each QPP unit j, $1 \leq j \leq L$, may be provided to a data multiplexer to select a memory from a plurality of memories. Each data of the input sequence may be written to a corresponding memory address based on the memory selected through the MSB n bits and the address designated by LSB n bits.

In summary, the disclosed exemplary embodiments provide an address generation apparatus and method for QPP interleaver. A plurality of QPP units may directly compute increasing interleaver addresses or decreasing interleaver address. Each QPP unit may compute and output a corresponding group of interleaver addresses or decreasing interleaver addresses in parallel. For MAP processors with radix-$R(=2^r)$, each original parallel output of interleaver address may be expanded to r parallel interleaver addresses for output. For a MAP processor with different radix-R, the corresponding increasing interleaver address or decreasing address may be generated to correspond to the increasing or decreasing metric computation of the MAP processor. The QPP interleaver address generation apparatus of the disclosed exemplary embodiments may configure the original interleaver length K into K/M interleaver lengths of M without changing the original circuit. The disclosed exemplary embodiments use low complexity circuits, and need no memory space to store interleaver addresses, so that the hardware area is greatly reduced and the computation speed for interleaver address is improved. The disclosed exemplary embodiments may be applicable to mobile communication systems, such as, 3GPP LTE and LTE-A.

Although the present disclosure has been described with reference to the exemplary embodiments, it will be understood that the disclosure is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An address generation apparatus for quadratic permutation polynomial (QPP) interleaver, comprising:

L QPP units, represented as QPP unit 1–QPP unit L, $L \geq 2$, said apparatus, according to a QPP function $\Pi(i)=(f_1 i + f_2 i^2) \bmod k$, $f_1$ and $f_2$ being QPP coefficients, $0 \leq i \leq k-1$, k being information block length of an input sequence, receiving a plurality of configurable parameters and using said L QPP units to compute and output a plurality of interleaver addresses;

wherein said $\Pi(i)$ is an $i^{th}$ interleaver address generated by said apparatus, and each QPP unit j, $1 \leq j \leq L$, is a parallel computation unit and outputs in parallel a corresponding group of interleaver addresses.

2. The apparatus as claimed in claim 1, wherein said group of interleaver addresses is a group of increasing interleaver addresses or a group of decreasing interleaver addresses, and when said group of interleaver addresses is said group of increasing interleaver addresses, said group of interleaver addresses outputted by said QPP unit j in parallel are $\Pi(i+(j-1)M)$, $\Pi(i+(j-1)M+1)$, . . . , $\Pi(i+(j-1)M+(r-1))$, and when said group of interleaver addresses is said group of decreasing interleaver addresses, said group of interleaver addresses outputted by said QPP unit j in parallel are $\Pi(jM-i-1)$, $\Pi(jM-i-2)$, . . . , $\Pi(jM-i-r)$, $M=k/L$, M is a positive integer, $1 \leq r \leq k$.

3. The apparatus as claimed in claim 2, wherein M is equal to $2^n$, and n is a positive integer.

4. The apparatus as claimed in claim 2, wherein a hardware structure of said QPP unit 1 is realized by r+1 multiplexers, r registers, and 2r 2-input-add-mod circuits, in combination with at least a control signal.

5. The apparatus as claimed in claim 2, wherein for $2 \leq j \leq L$, a hardware structure of said QPP unit j is realized by r registers and r 2-input-add-mod circuits.

6. The apparatus as claimed in claim 3, for a MAP processor using different radix for parallel decoder architecture, said apparatus generates corresponding increasing or decreasing interleaver addresses to correspond to increasing or decreasing metric computations of said MAP processor.

7. The apparatus as claimed in claim 1, said apparatus is an address generation apparatus for interleaver or de-interleaver.

8. The apparatus as claimed in claim 1, wherein for $j \geq 2$, said QPP unit j receives computation result of said QPP unit j−1, respectively.

9. The apparatus as claimed in claim 1, wherein said configurable parameters are one set of configurable parameters $\{k, (f_1+f_2) \bmod k, 2f_2 \bmod k, f_1 M \bmod k, \Pi(0)\}$ or $\{k, f_2-f_1-2(M-1)f_2 \bmod k, 2f_2 \bmod k, f_1 M \bmod k, \Pi(M-1)\}$.

10. An address generation method for QPP interleaver, applicable to an encoder/decoder of a communication system, said method comprising:

according to a QPP function $\Pi(i)=(f_1 i + f_2 i^2) \bmod k$, inputting a plurality of configurable parameters; and computing and outputting a plurality of interleaver addresses by using L QPP units, each QPP unit j of said L QPP units, $1 \leq j \leq L$, being a parallel computation unit and outputting in parallel a corresponding group of interleaver addresses;

wherein said $\Pi(i)$ is an $i^{th}$ interleaver address generated by said method, said $f_1$ and $f_2$ are QPP coefficients, k is information block length of an input sequence, $0 \leq i \leq k-1$, mod is modulus operation, in this manner, information of said input sequence is stored into a plurality of corresponding memory addresses.

11. The method as claimed in claim 10, wherein said group of interleaver addresses is a group of increasing interleaver addresses or a group of decreasing interleaver addresses, and when said group of interleaver addresses is said group of increasing interleaver addresses, said group of interleaver addresses outputted by said QPP unit j in parallel are $\Pi(i+(j-1)M), \Pi(i+(j-1)M+1), \ldots, \Pi(i+(j-1)M+(r-1))$; and when said interleaver addresses is said group of decreasing interleaver addresses, said group of interleaver addresses outputted by said QPP unit j in parallel are $\Pi(jM-i-1), \Pi(jM-i-2), \ldots, \Pi(jM-i-r)$, M=k/L, M is a positive integer, $1 \leq r \leq k$.

12. The method as claimed in claim 11, wherein M is equal to $2^n$, and n is a positive integer.

13. The method as claimed in claim 11, wherein n least significant bits (LSB) of said $i^{th}$ interleaver address $\Pi(i)$ are used as address of L memories for writing the information of said input sequence into.

14. The method as claimed in claim 12, wherein n most significant bits (MSB) of said $i^{th}$ interleaver address $\Pi(i)$ are provided to a data matrix multiplexer to select L corresponding memories.

15. The method as claimed in claim 11, wherein said configurable parameters are one set of configurable parameters $\{k, (f_1+f_2) \bmod k, 2f_2 \bmod k, f_1 M \bmod k, \Pi(0)\}$ or $\{k, f_2-f_1-2(M-1)f_2 \bmod k, 2f_2 \bmod k, f_1 M \bmod k, \Pi(M-1)\}$.

16. The method as claimed in claim 11, wherein the information of said input sequence is outputted in parallel through L sliding windows, and M is the width of each of the L sliding windows.

\* \* \* \* \*